United States Patent
Levy

(10) Patent No.: US 8,168,546 B2
(45) Date of Patent: May 1, 2012

(54) METHOD FOR SELECTIVE DEPOSITION AND DEVICES

(75) Inventor: David H. Levy, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 350 days.

(21) Appl. No.: 12/622,496

(22) Filed: Nov. 20, 2009

(65) Prior Publication Data

US 2011/0120757 A1    May 26, 2011

(51) Int. Cl.
*H01L 21/44* (2006.01)
*H01L 21/469* (2006.01)
*H01L 21/31* (2006.01)

(52) U.S. Cl. ........ 438/765; 438/680; 438/762; 438/763; 438/758; 438/778; 257/E21.17; 257/E21.171; 257/E21.269; 257/E21.487

(58) Field of Classification Search ............. 257/E21.17, 257/E21.171, E21.409, E21.487
See application file for complete search history.

(56) References Cited

U.S. PATENT DOCUMENTS

| | | | |
|---|---|---|---|
| 7,030,001 B2 | 4/2006 | Adetutu et al. | |
| 7,160,819 B2 | 1/2007 | Conley, Jr. et al. | |
| 7,413,982 B2 * | 8/2008 | Levy ............................ | 438/680 |
| 7,445,731 B2 | 11/2008 | Okada et al. | |
| 2006/0001726 A1 | 1/2006 | Kodas et al. | |
| 2009/0051740 A1 | 2/2009 | Hiroshima | |
| 2009/0051749 A1 * | 2/2009 | Baker ............................ | 347/106 |
| 2009/0078204 A1 * | 3/2009 | Kerr et al. .................... | 118/728 |
| 2009/0081366 A1 * | 3/2009 | Kerr et al. ................. | 427/255.28 |
| 2009/0081827 A1 | 3/2009 | Yang et al. | |
| 2009/0102023 A1 | 4/2009 | Wege et al. | |
| 2009/0130858 A1 | 5/2009 | Levy | |

OTHER PUBLICATIONS

Ashwini Sinha et al., "Area selective atomic layer deposition of titanium dioxide: Effect of precursor chemistry", J. Vac. Sci. Technol. B 24 (6), Nov./Dec. 2006, pp. 2523-2532.
M. Yan et al, "Selective-area atomic layer epitaxy growth of ZnO features on soft lithography-patterned substrates", Applied Physics Letters, 79, (11), Sep. 10, 2001, pp. 1709-1711.
Enoch Kim et al., "Solvent-Assisted Microcontact Molding: A Convenient Method for Fabricating Three-Dimensional Structures on Surfaces of Polymers**", Adv. Mater. 1997, 9, No. 8, pp. 651-654.
Pamela M. St. John et al, "Microcontact printing and pattern transfer using trichlorosilanes on oxide substrates", Appl. Phys. Letters, 68 (7), Feb. 12, 1996 pp. 1022-1024.
U.S. Appl. No. 12/622,530 filed Nov. 20, 2009, titled Method for Selective Deposition and Devices, by David H. Levy.
U.S. Appl. No. 12/622,506 filed Nov. 20, 2009, titled Method for Selective Deposition and Devices, by David H. Levy.
U.S. Appl. No. 12/622,519 filed Nov. 20, 2009, titled Method for Selective Deposition and Devices, by David H. Levy.
U.S. Appl. No. 12/622,550 filed Nov. 20, 2009, titled Method for Selective Deposition and Devices, by David H. Levy, et al.
U.S. Appl. No. 12/622,660 filed Nov. 20, 2009, titled Composition and Method of Use, by David H. Levy, et al.
U.S. Appl. No. 13/313,055 filed Dec. 7, 2011, titled Electronic Device, by David H. Levy.

* cited by examiner

*Primary Examiner* — Mohsen Ahmadi
(74) *Attorney, Agent, or Firm* — J. Lanny Tucker

(57) ABSTRACT

A chemical vapor deposition method such as an atomic-layer-deposition method for forming a patterned thin film includes applying a deposition inhibitor material to a substrate. The deposition inhibitor material is a hydrophilic polymer that is has in its backbone, side chains, or both backbone and side chains, multiple secondary or tertiary amide groups that are represented by the following acetamide structure: >N—C (=O)—. The deposition inhibitor material is patterned simultaneously or subsequently to its application to the substrate, to provide selected areas of the substrate effectively not having the deposition inhibitor material. A thin film is substantially deposited only in the selected areas of the substrate not having the deposition inhibitor material.

16 Claims, 14 Drawing Sheets

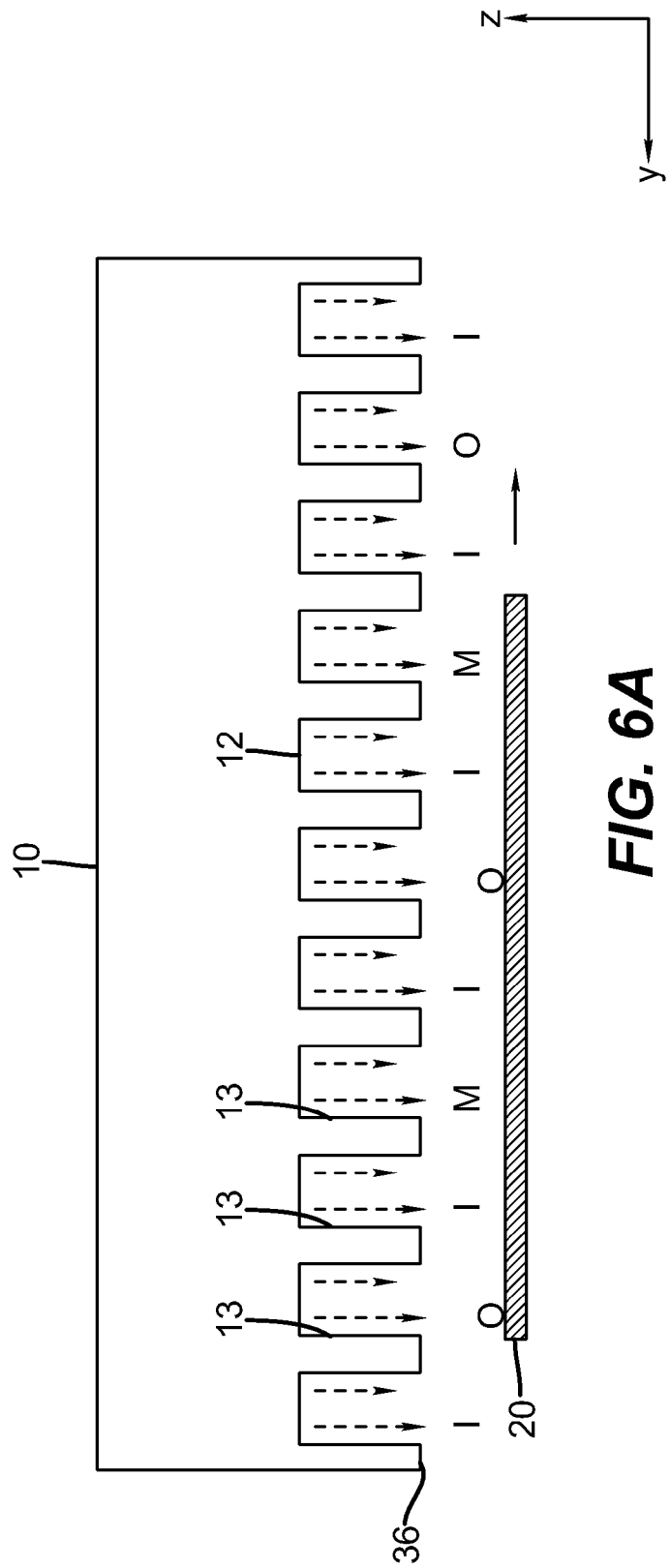

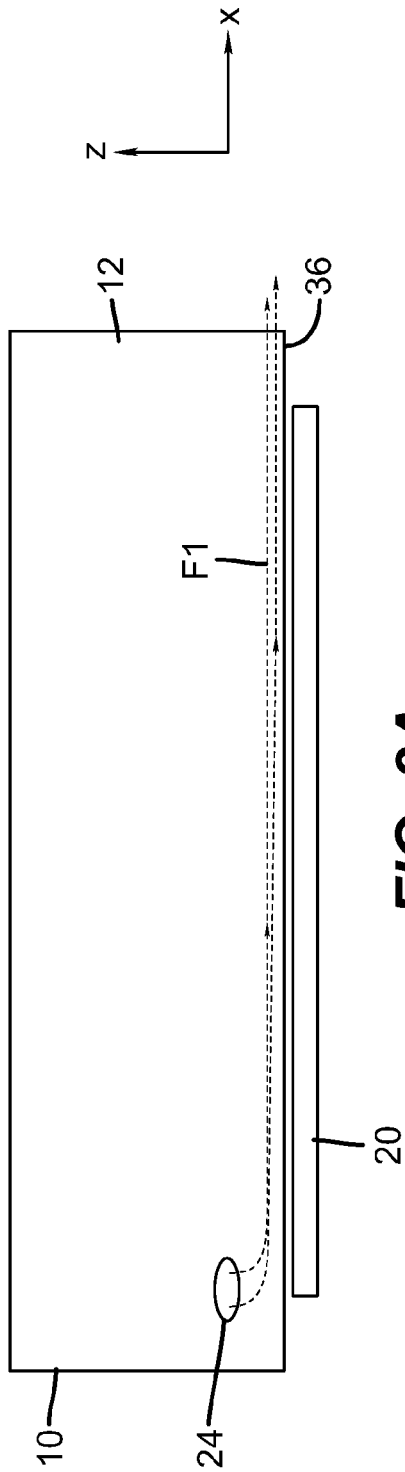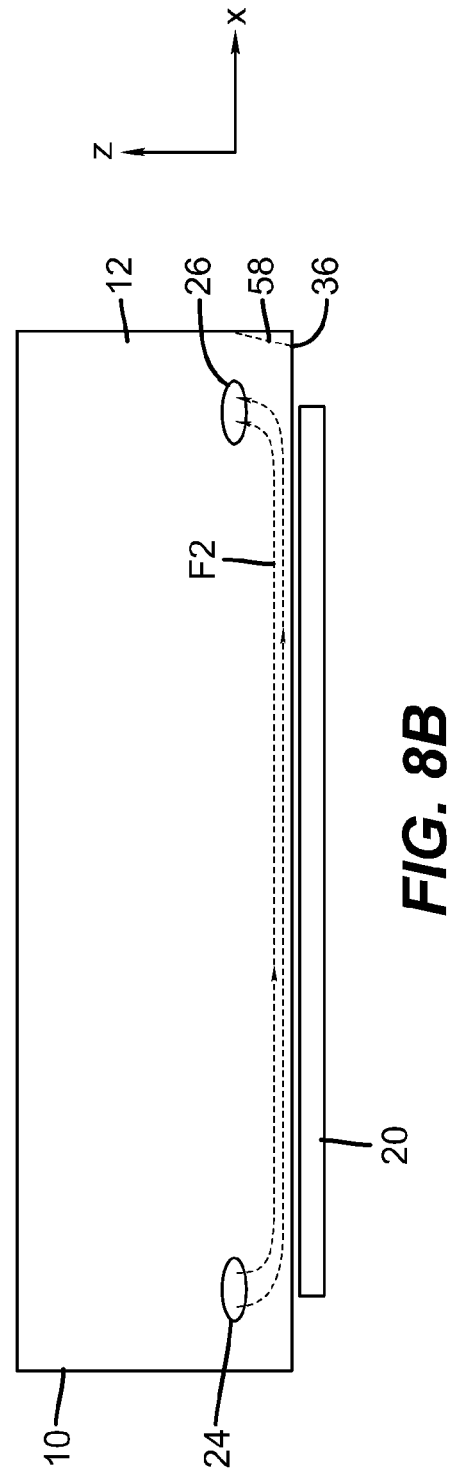

METHOD FOR SELECTIVE DEPOSITION AND DEVICES

COPENDING AND COMMONLY ASSIGNED APPLICATIONS

Reference is made to the following copending and commonly assigned U.S. patent applications, filed on even date herewith:

U.S. Ser. No. 12/ 622,530 filed by myself and entitled "METHOD FOR SELECTIVE DEPOSITION AND DEVICES";

U.S. Ser. No. 12/ 622,506 filed by myself and entitled "METHOD FOR SELECTIVE DEPOSITION AND DEVICES";

U.S. Ser. No. 12/ 622,519 filed by myself and entitled "METHOD FOR SELECTIVE DEPOSITION AND DEVICES";

U.S. Ser. No. 12/ 622,550 filed by myself and Lee W. Tutt and entitled "METHOD FOR SELECTIVE DEPOSITION AND DEVICES"; and U.S. Ser. No. 12/ 622,660 filed by myself and Gregory Zwadlo and entitled "DEPOSITION INHIBITOR COMPOSITION AND METHOD OF USE".

FIELD OF THE INVENTION

This invention relates to a method of atomic layer deposition of materials onto a substrate and the use of specific polymers containing acetamide moieties as deposition inhibitor materials in selective deposition. This invention also relates to electronic devices prepared using this method.

BACKGROUND OF THE INVENTION

Modern-day electronics require multiple patterned layers of electrically or optically active materials, sometimes over a relatively large substrate. Electronics such radio frequency identification (RFID) tags, photovoltaics, and optical and chemical sensors all require some level of patterning in their electronic circuitry. Flat panel displays, such as liquid crystal displays or electroluminescent displays rely upon accurately patterned sequential layers to form thin film components of the backplane. These components include capacitors, transistors, and power buses. The industry is continually looking for new methods of materials deposition and layer patterning for both performance gains and cost reductions.

Thin film transistors (TFTs) may be viewed as representative of the electronic and manufacturing issues for many thin film components. TFTs are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. For applications in which a transistor needs to be applied to a substrate, a thin film transistor is typically used. A critical step in fabricating the thin film transistor involves the deposition of a semiconductor onto the substrate. Presently, most thin film devices are made using vacuum deposited amorphous silicon as the semiconductor, which is patterned using traditional photolithographic methods. Amorphous silicon as a semiconductor for use in TFTs still has its drawbacks. Thus, there has been active work to find a suitable replacement.

There is a growing interest in depositing thin film semiconductors on plastic or flexible substrates, particularly because these supports would be more mechanically robust, lighter weight, and allow more economic manufacturing, for example, by allowing roll-to-roll processing. A useful example of a flexible substrate is polyethylene terephthalate. Such plastics, however, limit device processing to below 200° C.

In spite of the potential advantages of flexible substrates, there are many problems associated with plastic supports when using traditional photolithography during conventional manufacturing, making it difficult to perform alignments of transistor components across typical substrate widths up to one meter or more. Traditional photolithographic processes and equipment may be seriously impacted by the substrate's maximum process temperature, solvent resistance, dimensional stability, water, and solvent swelling, all key parameters in which plastic supports are typically inferior to glass.

There is interest in utilizing lower cost processes for deposition that do not involve the expense associated with vacuum processing and patterning with photolithography. In typical vacuum processing, a large metal chamber and sophisticated vacuum pumping systems are required in order to provide the necessary environment. In typical photolithographic systems, much of the material deposited in the vacuum chamber is removed. The deposition and photolithography items have high capital costs and preclude the easy use of continuous web based systems.

In the past decade, various materials have received attention as a potential alternative to amorphous silicon for use in semiconductor channels of thin film transistors. The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below. Additionally, metal oxide dielectrics such as alumina ($Al_2O_3$) and $TiO_2$ are useful in practical electronics applications as well as optical applications such as interference filters.

In addition, metal oxide materials can serve as barrier or encapsulation elements in various electronic devices. These materials also require patterning so that a connection can be made to the encapsulated devices.

Although successful thin films in electronic devices have been made with sputtering techniques, it is clear that very precise control over the reactive gas composition (such as oxygen content) is required to produce good quality devices. Chemical vapor deposition (CVD) techniques, in which one or more reactive gasses decompose or react to form the desired film material at a surface, can be useful routes to achieving high quality film growth. Atomic layer deposition ("ALD") is yet an alternative film deposition technology that can provide improved thickness resolution and conformal capabilities, compared to its CVD predecessor. The ALD process segments the conventional thin-film deposition process of conventional CVD into single atomic-layer deposition steps.

ALD can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors. Examples of useful semiconducting materials are compound semiconductors such as gallium arsenide, gallium nitride, cadmium sulfide, zinc oxide, and zinc sulfide.

Advantageously, ALD steps are self-terminating and can deposit precisely one atomic layer when conducted up to or beyond self-termination exposure times. An atomic layer typically ranges from about 0.1 to about 0.5 molecular monolayers with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of gas phase nucleation can be tolerated.

In ALD processes, typically two molecular precursors are introduced into the ALD reactor in separate stages. The details of such stages and molecular precursors useful in each are explained in [0016]-[0034] of U.S. Patent Application Publication 2009/0081827 (Yang et al.) that is incorporated herein by reference along with the references mentioned in these paragraphs.

U.S. Patent Application Publication 2005/0084610 (Selitser) discloses an atmospheric pressure atomic layer chemical vapor deposition process that involve separate chambers for each stage of the process and a series of separated injectors are spaced around a rotating circular substrate holder track.

A spatially dependent ALD process can be accomplished with other apparatus or methods described in more detail in WO 2008/082472 (Cok), U.S. Patent Application Publications 2008/0166884 (Nelson et al.), 2008/0166880 (Levy), 2009/0130858 (Levy), 2009/0078204 (Kerr et al.), 2009/0051749 (Baker), 2009/0081366 (Kerr et al.), and U.S. Pat. No. 7,413,982 (Levy), U.S. Pat. No. 7,456,429 (Levy), and U.S. Pat. No. 7,572,686 (Levy et al.), all of which are hereby incorporated by reference in their entirety. These publications described various attempts to overcome one of the difficult aspects of a spatial ALD system, which is undesired intermixing of the continuously flowing mutually reactive gases.

There is growing interest in combining ALD with a technology known as selective area deposition (or "SAD") in which a material is deposited only in those areas that are desired or selected. Sinha et al. [*J. Vac. Sci. Technol.* B 24 6 2523-2532 (2006)] have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. One approach to combining patterning and depositing the semiconductor is shown in U.S. Pat. No. 7,160,819 (Conley et al) that describes materials for use in patterning zinc oxide on silicon wafers.

A number of materials have been used by researchers as deposition inhibitor materials for selective area deposition. Sinha et al., referenced above, used poly(methyl methacrylate) (PMMA) in their masking layer. Conley et al. employed acetone and deionized water, along with other process contaminants as deposition inhibitor materials.

U.S. Patent Application Publications 2009/0081827 and 2009/0051740 (both noted above) describe the use of crosslinkable organic compounds or polymers, such as organosiloxane polymers, as deposition inhibitor materials, in ALD processes to provide various electronic devices. These crosslinkable materials are generally coated out of organic solvents. There is a need to avoid the use of organic solvents in providing deposition inhibitors when fabricating various useful devices using chemical vapor deposition techniques such as ALD.

The problem with these previously used materials is that they rely upon polymers that are soluble only in aggressive organic solvents. Aside from health and environmental concerns, the use of aggressive organic solvents is difficult in a large scale manufacturing process. Among these disadvantages include: (a) cleanup of coated materials must be done with similar organic solvents, leading to increased solvent usage, and (b) many of the printing technologies proposed for printed electronics leverage elastomer printing plates that swell upon contact with aggressive organic solvents. Therefore, there has been a need for selective deposition inhibitors that are soluble in environmentally friendly solvents, principally water and alcohols, and can be applied as aqueous formulations.

SUMMARY OF THE INVENTION

This invention provides a deposition method for forming a patterned thin film comprising:
A) applying a composition comprising a deposition inhibitor material to a substrate,
B) simultaneously or subsequently to step A), patterning the deposition inhibitor material to provide selected areas on the substrate where the deposition inhibitor material is absent, and
C) depositing an inorganic thin film on the substrate by chemical vapor deposition only in those areas where the deposition inhibitor material is absent,
wherein the deposition inhibitor material is a hydrophilic polymer that has in its backbone, side chains, or both backbone and side chains, multiple secondary or tertiary amide groups that are represented by the following acetamide structure:

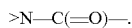

Electronic devices that can be obtained from the method of the present invention include integrated circuits, active-matrix displays, solar cells, active-matrix imagers, sensors, and rf labels.

This invention also provides an electronic device having a substrate and having thereon:
a deposited pattern of a composition comprising a deposition inhibitor material, and
a deposited inorganic thin film disposed only in selected areas of the substrate where the composition comprising a deposition inhibitor material is absent,
wherein the deposition inhibitor material is a hydrophilic polymer that that has in its backbone, side chains, or both backbone and side chains, multiple secondary or tertiary amide groups that are represented by the following acetamide structure:

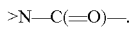

In some embodiments, the inorganic thin film is deposited using spatially dependant ALD that comprises:
  providing a series of gas channels, each in contact with a discrete separate region of a substrate, and each gas channel having a gas composition, the gas composition comprising, in order, at least a first reactive gaseous material, an inert purge gas, and a second reactive gaseous material, and optionally repeating this sequence a plurality of times,
  moving the substrate relative to the gas channels so that a portion of the substrate comes into contact sequentially with at least two gas zones,
  wherein the first reactive gaseous material is capable of reacting with a substrate surface that has been treated with the second reactive gaseous material to form the inorganic thin film.

It is an advantage of the present invention that selective deposition of metal oxides and other materials can be used in a chemical vapor deposition process such as ALD system, for example a spatially dependent ALD system. It is yet a further advantage of the present invention that it is adaptable for deposition on a web or other moving substrate, including deposition onto a large area substrate. It is another that the invention allows operation under atmospheric pressure conditions, for example in low temperature processes at atmospheric pressures in an unsealed environment or open to ambient atmosphere.

The present invention provides for the deposition of a deposition inhibitor material that can be applied in an aqueous medium instead of a strictly organic solvent medium. Thus, this aqueous medium or solution comprises at least 50% by weight water.

These advantages are provided by using a unique deposition inhibitor material that is a hydrophilic polymer that has in its backbone, side chains, or both backbone and side chains, multiple secondary or tertiary amide groups that are represented by the following acetamide structure and as defined in more detail below:

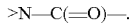

Other objects, features, and advantages of the present invention will become apparent to those skilled in the art upon a reading of the following detailed description when taken in conjunction with the drawings that show and describe illustrative embodiments of the invention.

BRIEF DESCRIPTION OF THE DRAWINGS

FIGS. 6A and 6B are cross-sectional side views of one embodiment of the distribution of a system of gaseous materials, schematically showing the accompanying deposition operation;

FIGS. 8A and 8B are cross-sectional views taken orthogonally to the cross-sectional views of previous FIGS. 4, 5, 6A, and 6B, showing gas flow directions for output channels in various embodiments.

DETAILED DESCRIPTION OF THE INVENTION

Definitions

Figure 1:
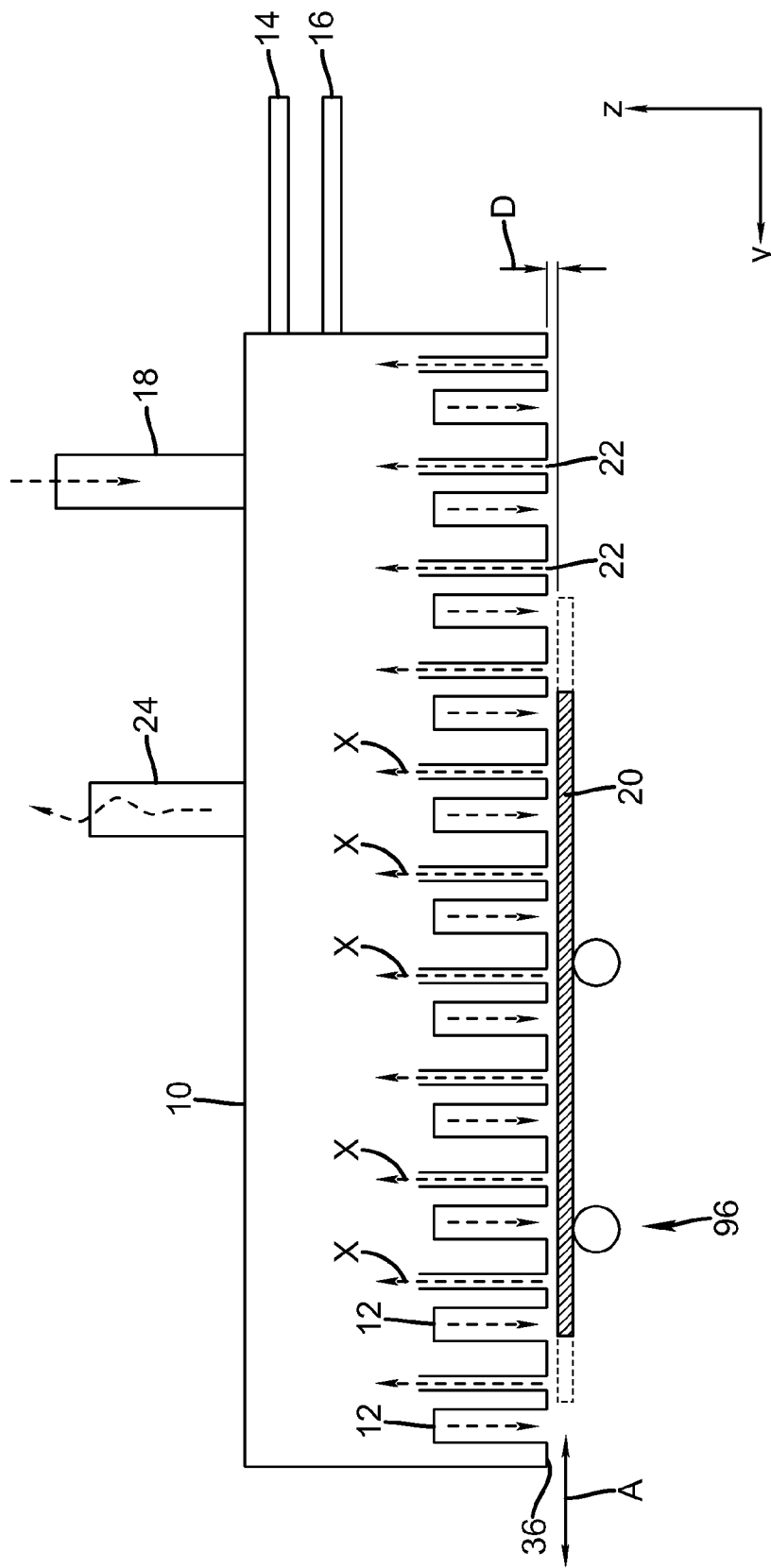
FIG. 1 is a cross-sectional side view of a delivery head for atomic layer deposition for one embodiment of the present invention.

As used herein, the term "hydrophilic polymer" refers to a naturally occurring or synthetically prepared organic compound having a molecular weight of at least 1,000. This organic compound is soluble in an aqueous solution comprising 50% water and the rest comprising one or more water-miscible organic solvents for example alcohols (such as methanol, ethanol, n-propanol, 2-propanol, t-butyl alcohol, glycerin, dipropylene glycol, ethylene glycol, and polypropylene glycol), ketones (such as acetone and methyl ethyl ketone), glycol ethers (such as ethylene glycol monomethyl ether, ethylene glycol monoethyl ether, ethylene glycol monobutyl ether, diethylene glycol monoethyl ether, diethylene glycol monobutyl ether, diethylene glycol diethyl ether, triethylene glycol monobutyl ether, and dipropylene glycol monomethyl ether), and water-soluble nitrogen-containing organic solvents (such as 2-pyrrolidone and N-methyl pyrrolidone), and ethyl acetate.

Thus, the hydrophilic polymer satisfies both of the following tests:
  a) it is soluble to at least 1% by weight in a solution containing at least 50 weight % water as measured at 40° C., and
  b) it provides an inhibition power of at least 200 Å to deposition of zinc oxide by an ALD process.

The term "deposition inhibitor material" refers herein to a material applied to the substrate as well as the material resulting from any optionally subsequent crosslinking or other reaction that modifies the material that may occur prior to depositing an inorganic thin film on the substrate using a chemical vapor deposition technique.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The FIGS. provided with this application are not drawn to scale but are intended to show overall function and the structural arrangement of some embodiments of the present invention.

Deposition Methods

The present invention provides various electronic devices including but not limited to, integrated circuits, active-matrix displays, solar cells, active-matrix imagers, sensors, and rf labels using a suitable chemical vapor deposition method described herein. Such electronic devices have a substrate that can be composed of polymeric films (such as polyethylene terephthalate, polyethylene naphthalate, polyimide, polyetheretherketone (PEEK), or any polymer with suitable temperature resistance for electronics applications), ceramics, glasses, and metal foils including aluminum, steel, or stainless steel.

A deposited pattern of a composition that comprises a deposition inhibitor material is applied to the substrate. This composition comprises the hydrophilic polymer that is defined below. A deposited inorganic thin film is deposited only in selected areas of the substrate where the composition comprising a deposition inhibitor material is absent. Useful thin films are described below.

The composition comprising the deposition inhibitor material can be applied in a patternwise fashion using any conventional printing technology. Particularly useful printing technologies are inkjet, flexography, gravure printing, microcontact printing, offset lithography, patch coating, screen printing, and donor transfer methods. The deposition inhibitor may also be applied uniformly by any of the above methods, or by hopper coating, spin coating blade coating, or dip coating. After uniform coating, the deposition inhibitor can be patterned by exposure to radiation ranging from infrared to x-ray, mechanical embossing, or removal means, or by localized etching or surface treatment.

The functional thin film can be applied using a chemical vapor deposition (CVD) method, the general principles of which are described in many publications including Dobkin et al., *Principles of Chemical Vapor Deposition*, 1 Edition, Apr. 2003 and the *Handbook of Chemical Vapor Deposition* $2^{nd}$ Ed., Second Edition: Principles, Technology and Applications (Materials Science and Process Technology Series), Pierson et al., Jan. 14, 2000. Specific types of CVD systems include the use of tube reactions as described in U.S. Pat. No. 6,709,525 (Song), showerhead reactors as described in U.S. Pat. No. 6,284,673 (Dunham), and linear injector reactors as described in U.S. Pat. No. 5,136,975 (Bartholomew et al.), all of which publications are incorporated herein by reference.

While these methods can be used, it is best to carry out the present invention using atomic layer deposition (ALD). ALD processes can be understood from the background section and various publications cited therein. Additional teaching about ALD and useful apparatus for carrying out the process is provided in U.S. Pat. No. 7,105,054 (Lindfors), U.S. Pat. No. 7,085,616 (Chin et al.), U.S. Pat. No. 7,141,095 (Aitchison et al.), and U.S. Pat. No. 6,911,092 (Sneh), all of which are incorporated herein by reference.

The present invention employs a deposition inhibitor material described below that inhibits the deposition of the thin films on its surface. In this manner, portions of the substrate where there is a deposition inhibitor material will have little to no thin film growth, and in areas of the substrate that are generally free of the deposition inhibitor material will have thin film growth.

As noted above, useful deposition inhibitor materials include hydrophilic polymers having a free acid content of less than 2.5 meq/g of polymer and are soluble in an aqueous solution comprises at least 50% of water by weight. These hydrophilic polymers are generally not crosslinked since that will likely reduce their water-solubility. However, crosslinkable polymers may be useful where crosslinking is performed after application of the polymer. Crosslinking of the polymer may increase its stability especially in applications where the polymer remains in the constructed device.

Useful hydrophilic polymers have in their backbones, side chains, or both backbone and side chains, multiple secondary or tertiary amide groups that are represented by the following acetamide structure >N—C(=O)—. In some embodiments, at least some of the acetamide groups are recurring and form at least part of the hydrophilic polymer backbone through the nitrogen atom. In other embodiments, at least some of the acetamide groups are on side chains of the hydrophilic polymer and are represented by the following structure —N(R)—C(=O)—R' wherein R is hydrogen or an alkyl, cycloalkyl, or aryl group, and R' is an alkyl, cycloalkyl, or aryl group. For example, R is hydrogen or a substituted or unsubstituted alkyl having 1 to 4 carbon atoms and R' is a substituted or unsubstituted alkyl group having 1 to 3 carbon atoms. Examples of such hydrophilic polymers include but are not limited to, poly(vinyl pyrrolidone), poly(N-vinyl acetamide), and poly (2-ethyl-2-oxazoline), or a mixture of two or more of these polymers.

It is to be understood that of the hydrophilic polymers described above, not every hydrophilic polymer may perform optimally, but that a skilled artisan would be able to use routine experimentation to obtain the best hydrophilic polymer for a desired use.

The hydrophilic polymers described above can be applied singly or as mixtures particularly in aqueous formulations (containing water or mixtures of water and water-miscible organic solvents) that may include at least 0.1 weight %, generally from about 0.5 to about 5 weight %, and typically from 0.8 to 2 weight %, of the hydrophilic polymers. Particularly useful compositions comprising deposition inhibitor materials such as the hydrophilic polymers are described in copending and commonly assigned U.S. Ser. No. 12/622,660 filed by David Levy and Gregory Zwadlo and entitled "DEPOSITION INHIBITOR COMPOSITION AND METHOD OF USE", that is incorporated herein by reference.

The process of making the patterned thin film of present invention can be carried out below a maximum substrate temperature of about 600° C., or typically below 250° C., or even at temperatures as low as room temperature (about 25° C.). The temperature selection generally depends on the substrate and processing parameters known in the art, once one has the knowledge of the present invention contained herein. These temperatures are well below traditional integrated circuit and semiconductor processing temperatures, which enables the use of any of a variety of relatively inexpensive substrates, such as flexible polymeric supports. Thus, the invention enables production of relatively inexpensive circuits containing thin film transistors with significantly improved performance.

In one embodiment, the present method allows one to make thin films employing a system for delivery of gaseous materials to a substrate surface that can be adaptable to deposition on larger and web-based substrates and capable of achieving a highly uniform thin film deposition at improved throughput speeds. This method optionally employs a continuous spatially dependent ALD (as opposed to pulsed or time dependent ALD) gaseous material distribution. The method of the present invention optionally allows operation at atmospheric or near-atmospheric pressures and is capable of operating in an unsealed or open-air environment. Because of the use of the deposition inhibitor material described above, the thin film is deposited only in selected areas of a substrate.

Atomic layer deposition can be used to deposit a variety of inorganic thin films that are metals or that comprise a metal-containing compound. Such metal-containing compounds include, for example (with respect to the Periodic Table) a Group V or Group VI anion. Such metal-containing compound can include but are not limited to, oxides, nitrides, sulfides or phosphides for example of zinc, aluminum, titanium, hafnium, zirconium, or indium, or combinations of these metals. Useful metals include but are not limited to, copper, tungsten, aluminum, nickel, ruthenium, and rhodium.

Referring to FIG. 1, a cross-sectional side view of one embodiment of a delivery head 10 for atomic layer deposition onto a substrate 20 according to the present invention is shown. Delivery head 10 has a gas inlet conduit 14 that serves as an inlet port for accepting a first gaseous material, a gas inlet conduit 16 for an inlet port that accepts a second gaseous material, and a gas inlet conduit 18 for an inlet port that accepts a third gaseous material. These gases are emitted at an output face 36 via output channels 12, having a structural arrangement that may include a diffuser, as described subsequently. The dashed line arrows in FIG. 1 refer to the delivery of gases to substrate 20 from delivery head 10. In FIG. 1, dotted line arrows X also indicate paths for gas exhaust (shown directed upwards in this figure) and exhaust channels 22, in communication with an exhaust conduit 24 that provides an exhaust port. Since the exhaust gases may still contain quantities of unreacted precursors, it may be undesirable to allow an exhaust flow predominantly containing one reactive species to mix with one predominantly containing another species. As such, it is recognized that the delivery head 10 may contain several independent exhaust ports.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across output face 36 in reciprocating fashion, as indicated by the arrow A and by phantom outlines to the right and left of substrate. It should be noted that reciprocating motion is not always required for thin-film deposition using delivery head 10. Other types of relative motion between substrate 20 and delivery head 10 could also be provided, such as movement of either substrate 20 or delivery head 10, or both, in one or more directions.

Figure 2:
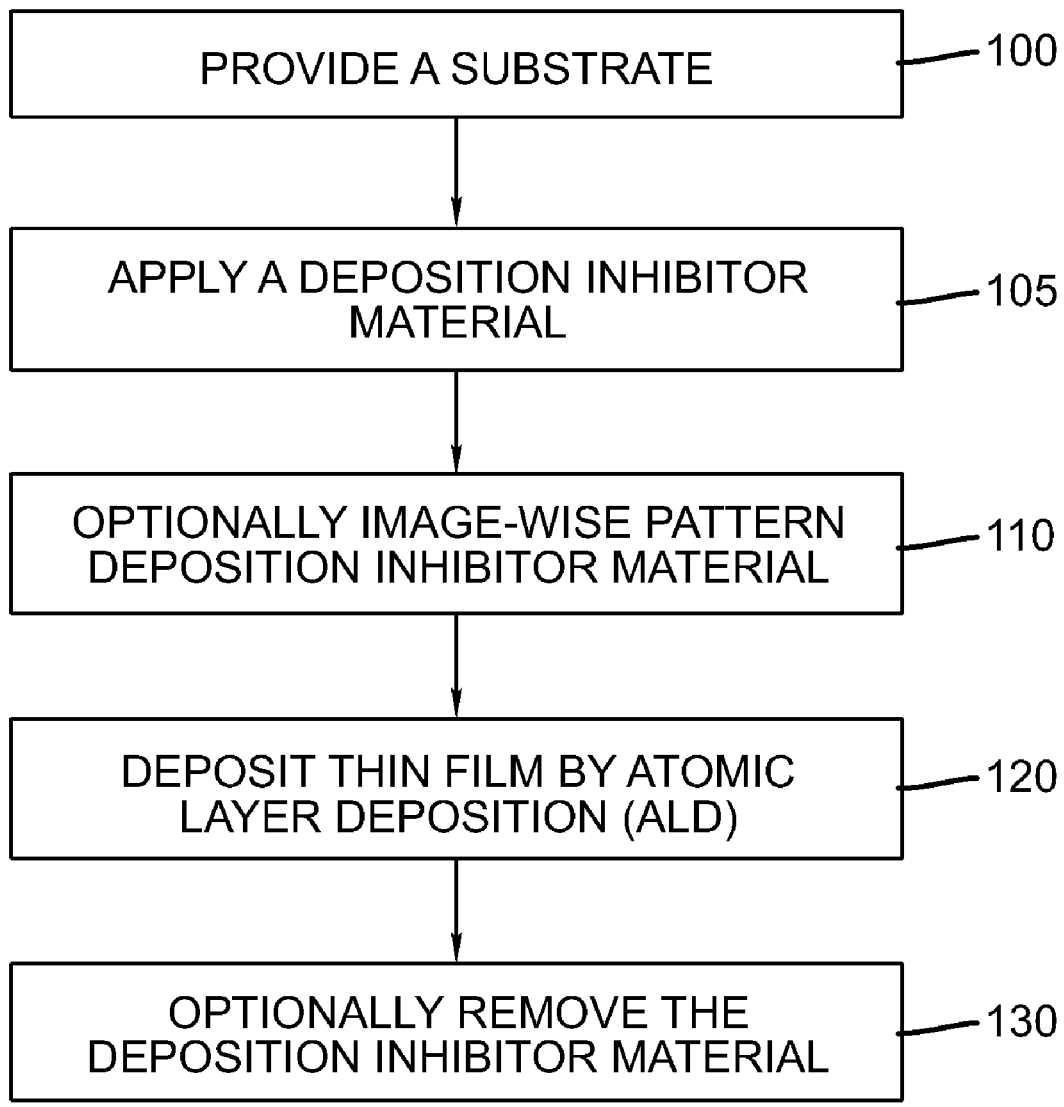
FIG. 2 is a flow chart describing one embodiment of the steps of the present invention.

FIG. 2 is a step diagram for one embodiment of a method of the present invention for making a patterned thin film using a combination of selected area deposition (SAD) and ALD. As shown in Step 100, a substrate is supplied into the system. In Step 105, a deposition inhibitor material is deposited. The deposition inhibitor material can generically be any material that causes the material deposition to be inhibited. In one embodiment, the deposition inhibitor material is chosen specifically for the material to be deposited. The deposition of the deposition inhibitor material in Step 105 can be in a patterned manner, such as using inkjet, flexography, gravure printing, microcontact printing, offset lithography, patch coating, screen printing, or donor transfer. In an alternative embodiment, Step 105 can be used to deposit a uniform layer of the deposition inhibitor material and Step 110 can be optionally employed to form a patterned layer of the deposition inhibitor material.

Continuing with FIG. 2, Step 120 deposits the desired thin film, for example, by an Atomic Layer Deposition (ALD) process. Generically this deposition can use any suitable chemical vapor deposition equipment, such as ALD equipment, for example with a spatially dependent ALD system. The thin film is deposited only in the areas of the substrate where there is no deposition inhibitor material. Depending on the use of the thin film, the deposition inhibitor material may remain on the substrate for subsequent processing or may be removed as shown in Step 130 of FIG. 2.

In some embodiments, the deposition inhibitor material is characterized by an inhibition power. Referring to FIG. 13B, the inhibition power is defined as the thickness of a deposited layer that can form in the uninhibited areas 215 before the onset of significant deposition in the inhibited areas 210.

Figure 3:
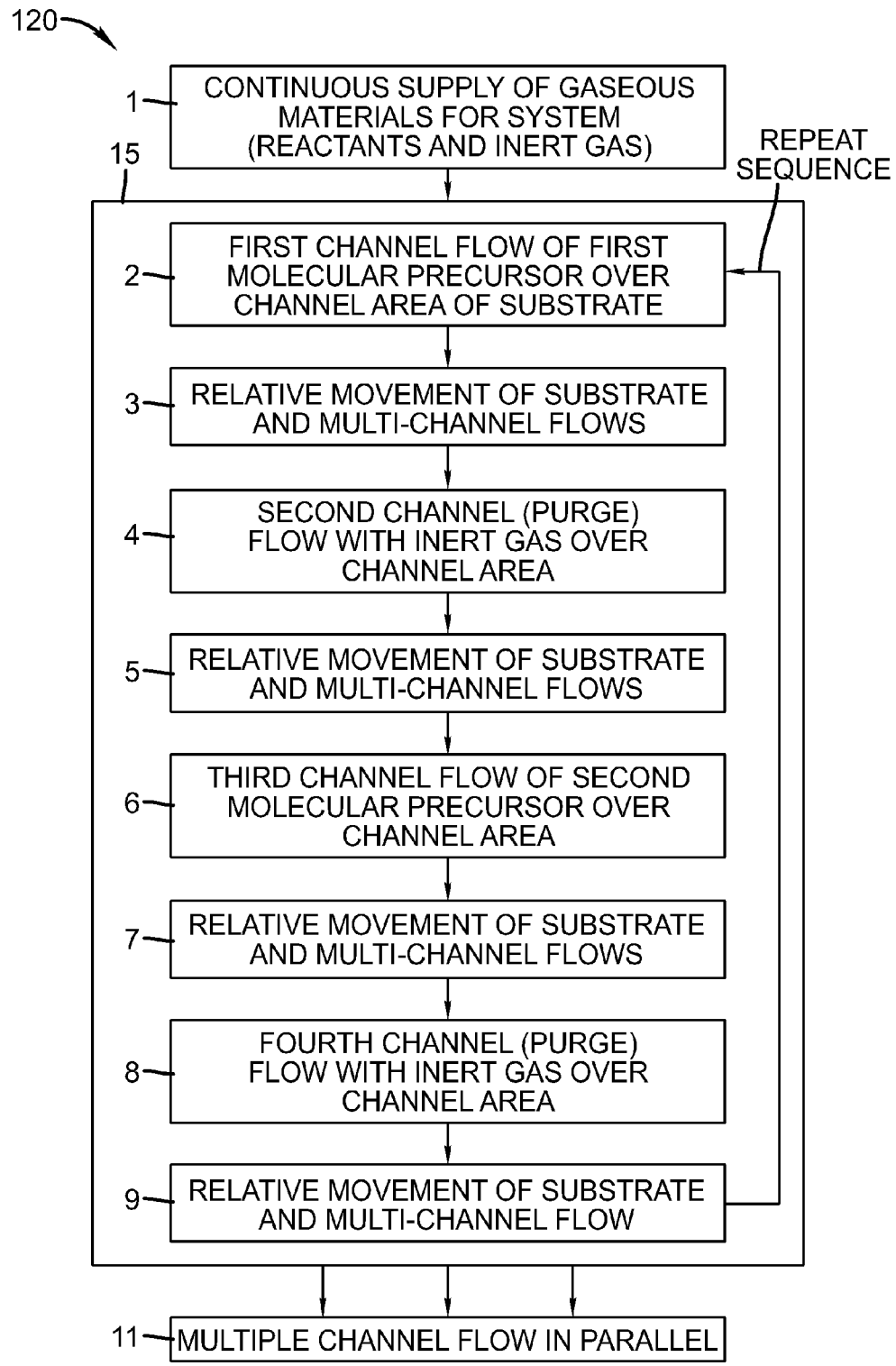
FIG. 3 is a flow chart describing the steps for an ALD process for use in the present invention.

FIG. 3 is a step diagram of a preferred embodiment of an ALD process 120 for making the thin film, in which two reactive gases are used, a first molecular precursor and a second molecular precursor. Gases are supplied from a gas source and can be delivered to the substrate, for example, via a deposition device. Metering and valving apparatus for providing gaseous materials to the deposition device can be used.

As shown in Step 1, a continuous supply of gaseous materials for the process is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel over the channel area of the substrate and reacts therewith. In Step 3 relative movement of the substrate and the multi-channel flows in the system occurs, which sets the stage for Step 4, in which second channel (purge) flow with inert gas occurs over the given channel area. Then, in Step 5, relative movement of the substrate and the multi-channel flows sets the stage for Step 6, in which the given channel area is subjected to atomic layer deposition in which a second molecular precursor now over the given channel area of the substrate and reacts with the previous layer on the substrate to produce (theoretically) a monolayer of a desired material. A first molecular precursor is in gas form, for example, an organometallic compound such as diethylzinc or trimethylaluminum. In such an embodiment, the second molecular precursor is also in gaseous form and can be, for example, a non-metallic oxidizing compound. The process of deposition can comprise flows of gaseous materials that are orthogonal towards the substrate, transverse across the face of the substrate, or some combination of both types of flows. For example, the channels comprise or are connected to a series of corresponding substantially parallel elongated openings in the output face of at least one delivery head for thin film deposition. More than one delivery head may be employed for deposition of one or more thin films.

In many forms of spatial ALD, the channels are small and in close proximity, with a length dimension in the direction of substrate motion that is less than 2 cm. Alternatively, the channel areas may be large areas of gas exposure as disclosed in U.S. Patent Application Publication 2007/0224348 (Dickey et al.).

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film. In this embodiment of the method, the steps are repeated with respect to a given channel area of the substrate, corresponding to the area covered by a flow channel. Meanwhile the various channels are being supplied with the necessary gaseous materials in Step 1. Simultaneous with the sequence of box 15 in FIG. 1, other adjacent channel areas are being processed, which results in multiple channel flows in parallel, as indicated in overall Step 11. As indicated above, parallel flow can be either substantially orthogonal or substantially parallel to the output face of the deposition device.

The primary purpose of the second molecular precursor is to condition the substrate surface back toward reactivity with the first molecular precursor. The second molecular precursor also provides material from the molecular gas to combine with metal at the surface, forming an oxide with the freshly deposited zinc-containing precursor.

This particular embodiment does not need to use a vacuum purge to remove a molecular precursor after applying it to the substrate. Purge steps are expected by most researchers to be the most significant throughput-limiting step in ALD processes.

Assuming that, for the two reactant gases in FIG. 3, AX and BY are used, for example. When the reaction gas AX flow is supplied and flowed over a given substrate area, atoms of the reaction gas AX are chemically adsorbed onto a substrate, resulting in a layer of A and a surface of ligand X (associative chemisorptions) (Step 2). The remaining reaction gas AX is then purged with an inert gas (Step 4). The flow of reaction gas BY and a chemical reaction between AX (surface) and BY (gas) occur, resulting in a molecular layer of AB on the substrate (dissociative chemisorptions) (Step 6). The remaining gas BY and by-products of the reaction are purged (Step 8). The thickness of the thin film may be increased by repeating the process cycle (steps 2-9) many times.

Because the film can be deposited one monolayer at a time it tends to be conformal and have uniform thickness.

Thin films of oxides that can be made using the method of the present invention include but are not limited to zinc oxide (ZnO), aluminum oxide ($Al_2O_3$), hafnium oxide, zirconium oxide, indium oxide, tin oxide, and others that would be readily apparent to a skilled worker. Mixed structure oxides that can be made using the process of the present invention can include but are not limited to InZnO. Doped materials that can be made using the process of the present invention can include but are not limited to ZnO:Al, $Mg_xZn_{1-x}O$, and LiZnO.

Thin films of metals that can be made using the method of the present invention include but are not limited to, copper, tungsten, aluminum, nickel, ruthenium, and rhodium. It will be apparent to the skilled artisan that alloys of two, three, or more metals may be deposited, compounds may be deposited with two, three, or more constituents, and graded films and nano-laminates may be produced as well.

These variations are simply variants using particular embodiments of the invention in alternating cycles. There are many other variations within the spirit and scope of the invention.

For various volatile zinc-containing precursors, precursor combinations, and reactants useful in ALD thin film processes, reference is made to the Handbook of *Thin Film Process Technology*, Vol. 1, edited by Glocker and Shah, Institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be also used by suitable surface treatment.

Figure 4:
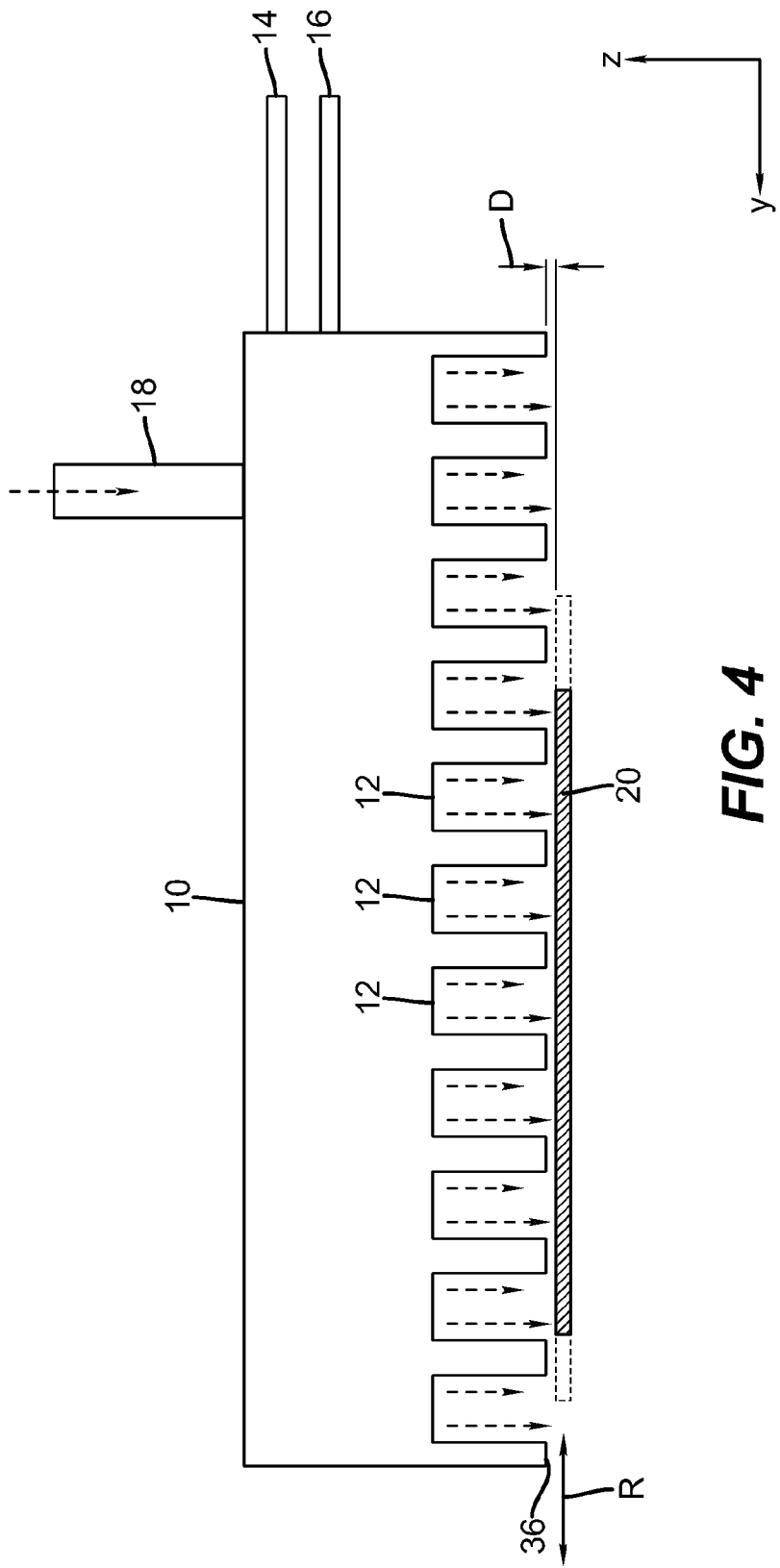
FIG. 4 is a cross-sectional side view of one embodiment of a deposition device for atomic layer deposition that can be used in the present process.

Referring now to FIG. 4, there is shown a cross-sectional side view of one embodiment of a delivery head 10 that can be used in the present method for atomic layer deposition onto a substrate 20 according to the present invention. Delivery head 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 4 and subsequent FIGS. 6A and 6B refer to the diffusive transport of the gaseous material, and not the flow, received from an output channel. In this particular embodiment, the flow is substantially directed out of the page of the figure, as described further below.

In one embodiment, gas inlet ports 14 and 16 are adapted to accept first and second gases that react sequentially on the substrate surface to effect ALD deposition, and gas inlet port 18 receives a purge gas that is inert with respect to the first and second gases. Delivery head 10 is spaced a distance D from substrate 20, provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 4, substrate 20 is moved across output face 36 in reciprocating fashion, as indicated by the arrow R and by phantom outlines to the right and left of substrate 20 in FIG. 4. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail subsequently.

Figure 5:
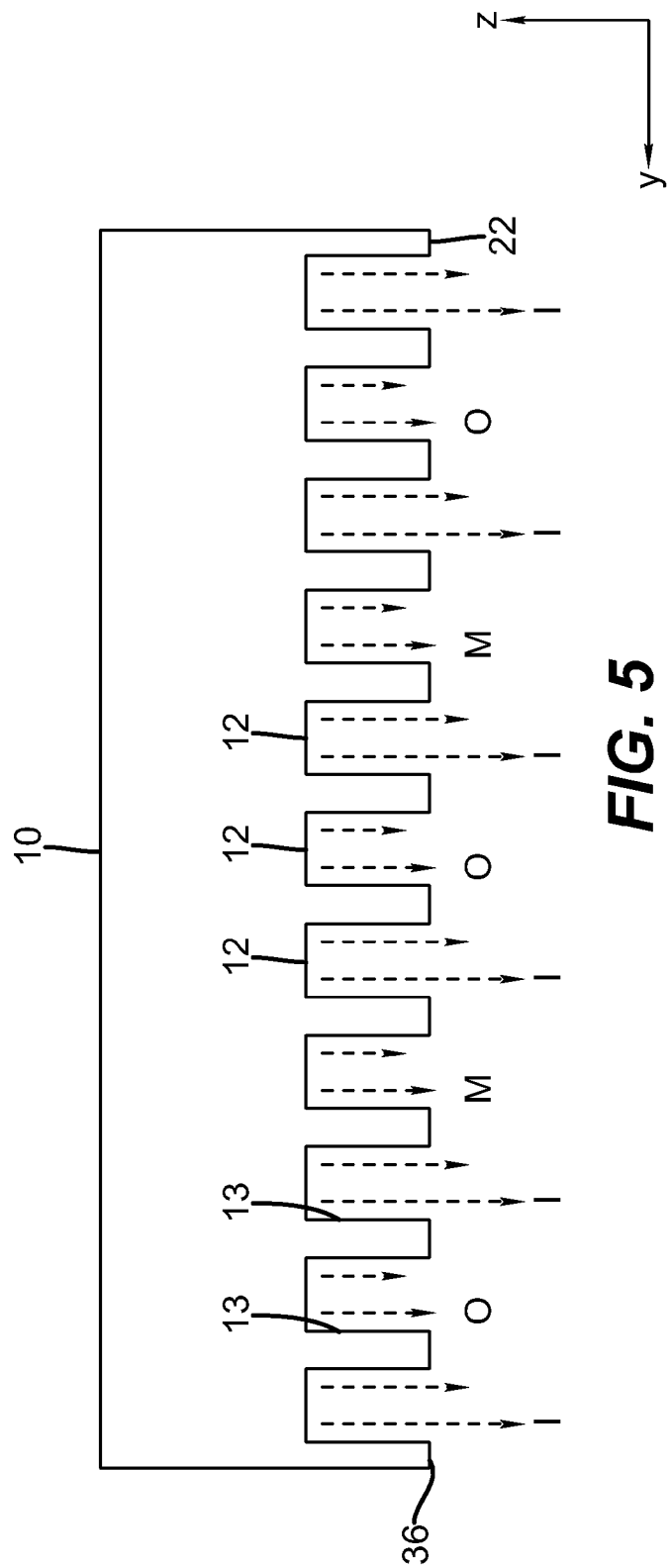
FIG. 5 is a cross-sectional side view of an embodiment, for one exemplary system of gaseous materials, of the distribution of gaseous materials to a substrate that is subject to thin film deposition.

The cross-sectional view of FIG. 5 shows gas flows emitted over a portion of output face 36 of delivery head 10. In this particular arrangement, each output channels 12, separated by partitions 13, is in gaseous flow communication with one of gas inlet ports 14, 16 or 18 seen in FIG. 4. Each output channel 12 delivers typically a first reactant gaseous material O, or a second reactant gaseous material M, or a third inert gaseous material I.

FIG. 5 shows a relatively basic or simple arrangement of gases. It is envisioned that a plurality of non-metal deposition precursors (like material O) or a plurality of metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. The inter-stream labeled I separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 5 and following suggests some typical types of reactant gases. For example, first reactant gaseous material O could be an oxidizing gaseous material. Second reactant gaseous material M could be an organo-metallic compound. In an alternative embodiment, O may represent a nitrogen- or sulfur-containing gaseous material for forming nitrides and sulfides. Inert gaseous material I could be nitrogen, argon, helium, or other gases commonly used as purge gases in ALD processes. Inert gaseous material I is inert with respect to first or second reactant gaseous materials O and M. Reaction between the first and second reactant gaseous materials would form a metal oxide or other binary compound, such as zinc oxide ZnO, in one embodiment. Reactions between more than two reactant gaseous materials could form other materials such as a ternary compound, for example, ZnAlO.

Figure 6B:
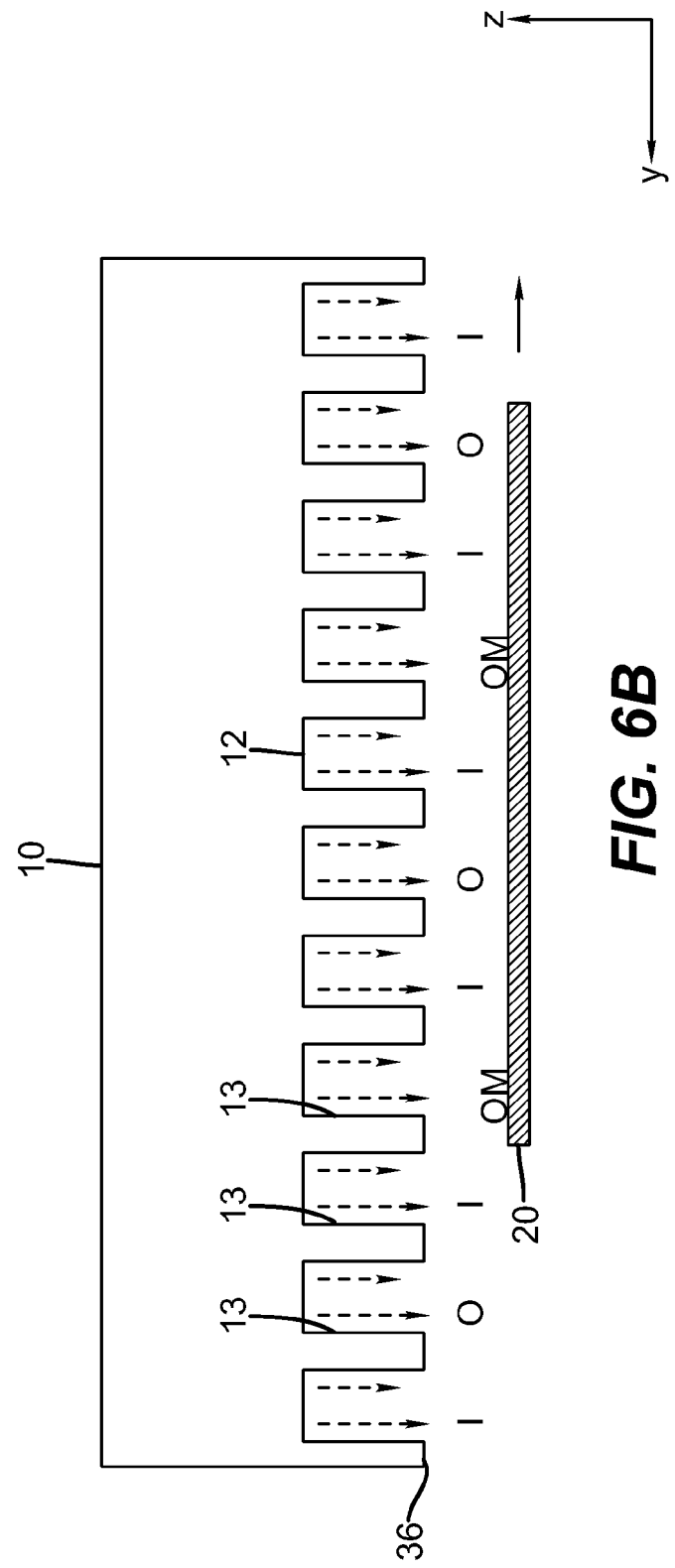

The cross-sectional views of FIGS. 6A and 6B show, in simplified schematic form, the ALD coating operation performed as substrate 20 passes along output face 36 of delivery head 10 when delivering reactant gaseous materials O and M. In FIG. 6A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 6A and 6B show, inert gaseous material I is provided in every alternate output channels 12, between the flows of first and second reactant gaseous materials O and M. Sequential output channels 12 are adjacent, that is, share a common boundary, formed by partitions 13 in the embodiments shown. Here, output channels 12 are defined and separated from each other by partitions 13 that extend at a perpendicular to the surface of substrate 20.

As mentioned above, in this particular embodiment, there are no vacuum channels interspersed between the output channels 12, that is, no vacuum (exhaust) channels on either side of a channel delivering gaseous materials to draw out the gaseous materials around the partitions. This advantageous, compact arrangement is possible because of the innovative gas flow that is used. Gas delivery arrays, in one embodiment, can apply substantially vertical (that is, perpendicular) gas flows against the substrate, but then must usually draw off spent gases in the opposite vertical direction, so that exhaust openings and channels would be desirable. A delivery head 10 that directs a gas flow (preferably substantially laminar in one embodiment) along the surface for each reactant and inert gas can more easily handle spent gases and reaction by-products in a different manner, as described subsequently. Thus, in one useful embodiment, the gas flow is directed along and generally parallel to the plane of the substrate surface. In other words, the flow of gases is substantially transverse to the plane of a substrate rather than perpendicular to the substrate being treated.

Figure 7:
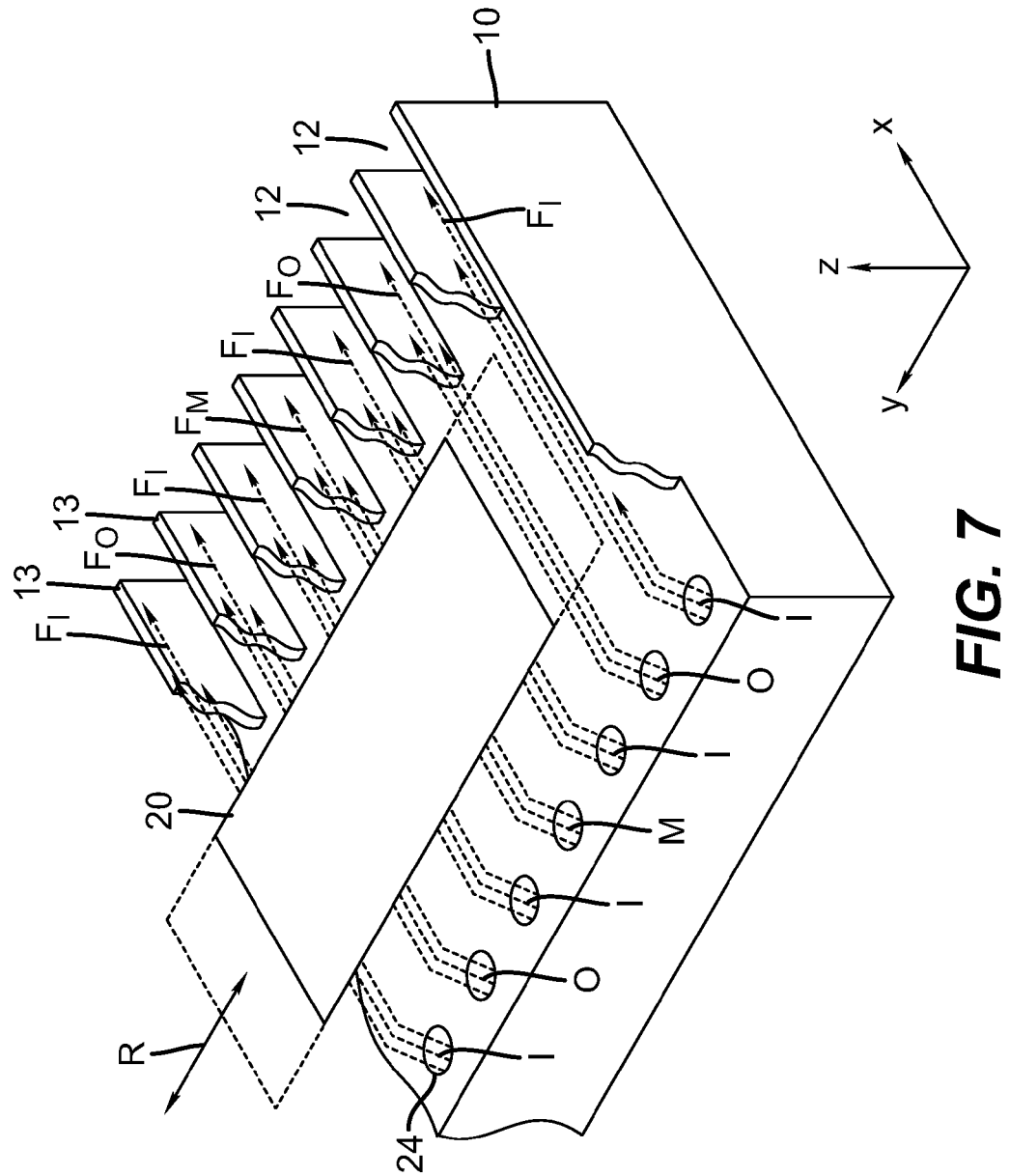
FIG. 7 is a perspective view, from the output face side, of a portion of one embodiment of a deposition device, showing the orientation of output channels relative to the substrate and reciprocating motion, showing one exemplary arrangement of gas flow in the deposition device.

FIG. 7 shows a perspective view of one such embodiment of delivery head 10 that can be used in the present process, from the output face 36 (that is, from the underside with respect to FIGS. 4-6B). Partitions 13 that define and separate the adjacent output channels 12 in this embodiment are represented as partially cut away, to allow better visibility for the gas flows flowing from gas outlet ports 24. FIG. 7 also shows reference x,y,z coordinate axis assignments used in the figures of this disclosure. Output channels 12 are substantially in parallel and extend in a length direction that corresponds to the x coordinate axis. Reciprocating motion of substrate 20, or motion relative to substrate 20, is in the y coordinate direction, using this coordinate assignment.

FIG. 7 shows the gas flows $F_I$, $F_O$, and $F_M$ for the various gaseous materials delivered from delivery head 10 with this embodiment. Gas flows $F_I$, $F_O$, and $F_M$ are in the x-direction, that is, along the length of elongated output channels 12.

The cross-sectional views of FIGS. 8A and 8B are taken orthogonally to the cross-sections of FIGS. 4-6B and show gas flows in one direction from this view. Within each output channel 12, the corresponding gaseous material flows from a gas output port 24, shown in phantom in the views of FIGS. 8A and 8B. In the embodiment of FIG. 8A, gas flow F1 directs the gaseous material along the length of output channel 12 and across substrate 20, as was described with reference to FIG. 7. Flow F1 continues past the edge of delivery head 10 in this arrangement, flowing outward into the environment or, if desirable, to a gas collection manifold (not shown). FIG. 8B shows an alternative embodiment for gas flow F2 in which output channel 12 also provides an exhaust port 26 for redirection or drawing off of the gas flow. Although unidirectional flows are useful, some degree of mixing can occur and even may be beneficial to some extent, depending on the flow rates and other circumstances involved in a particular application.

A particular delivery head 10 may use output channels 12 configured using any one of the gas flow configurations or combinations thereof, either the F1 flow of FIG. 8A, the F2 flow of FIG. 8B, or some other variation in which gaseous material is directed to flow across substrate 20 along output channel 12, for example in a substantially laminar or smooth fashion with controlled mixing. In one embodiment, one or more exhaust ports 26 are provided for each output channel 12 that delivers a reactant gaseous material. For example, referring to FIG. 7, output channels 12 for first and second reactant gaseous materials, labeled O and M, are configured with exhaust ports 26 to vent or draw off the reactant substances, following the pattern of flow F2 (FIG. 8B). This allows some recycling of materials and prevents undesirable mixing and reaction near the end of the manifold. Output channels 12 for inert gaseous material, labeled I, do not use exhaust ports 26 and thus follow the pattern of flow F1 (FIG. 8A). Although laminar flows are useful in some embodiments, some degree of mixing can occur and even may be beneficial to some extent, depending on the flow rates and other circumstances involved in a particular application.

Exhaust port 26 is not a vacuum port, in the conventional sense, but is simply provided to draw off the gaseous flow in its corresponding output channel 12, thus facilitating a uniform gas flow pattern within the channel. A negative draw, just slightly less than the opposite of the gas pressure at gas output port 24, can help to facilitate an orderly gas flow. The negative draw can, for example, operate at a pressure of between 0.9 and 1.0 atmosphere, whereas a typical vacuum is, for example, below 0.1 atmosphere. An optional baffle 58, as shown in dotted outline in FIG. 8B, may be provided to redirect the flow pattern into exhaust port 26.

Because no gas flow around partition 13 to a vacuum exhaust is needed, output face 36 can be positioned very closely, to within about 1 mil (approximately 0.025 mm) of the substrate surface. By comparison, an earlier approach such as that described in the U.S. Pat. No. 6,821,563 (Yudovsky) required gas flow around the edges of channel sidewalls and was thus limited to 0.5 mm or greater distance to the substrate surface. Positioning the delivery head 10 closer to the substrate surface is desired in the present invention. In one embodiment, distance D from the surface of the substrate can be 0.4 mm or less, or within 0.3 mm, typically within 0.25 mm of the output face of the deposition device or the bottom of the guide walls that provide the flow channels.

In order to provide smooth flow along the length of output channel 12, gas output port 24 may be inclined at an angle away from normal, as indicated in FIGS. 8A and 8B. Optionally, some type of gas flow redirecting structure may also be employed to redirect a downward flow from gas output port 24 so that it forms a gas flow that runs substantially in parallel to output face 36.

As was particularly described with reference to FIGS. 6A and 6B, delivery head 10 requires movement relative to the surface of substrate 20 in order to perform its deposition function. This relative movement can be obtained in a number of ways, including movement of either or both delivery head 10 and substrate 20, such as by movement of a process that provides a substrate support. Movement can be oscillating or reciprocating or could be continuous movement, depending on how many deposition cycles are needed. Rotation of a substrate can also be used, particularly in a batch process, although continuous processes are preferred.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For an example, delivery head 10, having a nominal channel width of 0.034 inches (0.086 cm) in width W for each output channel 12 and reciprocating motion (along the y axis as used herein) of at least 0.20 inches would be required. For this example, an area of substrate 20 would be exposed to both first reactant gaseous material O and second reactant gaseous material M with movement over this distance. In some cases, consideration for uniformity may require a measure of randomness to the amount of reciprocating motion in each cycle, such as to reduce edge effects or build-up along the extremes of reciprocation travel.

Delivery head 10 may have only enough output channels 12 to provide a single cycle. Alternately, delivery head 10 may have an arrangement of multiple cycles, enabling it to cover a larger deposition area or enabling its reciprocating motion over a distance that allows two or more deposition cycles in one traversal of the reciprocating motion distance.

In one embodiment, a given area of the substrate is exposed to a gas flow in a channel for less than 500 milliseconds, preferably less than 100 milliseconds. For example, the temperature of the substrate during deposition is under 600° C. or typically under 250° C.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 9:
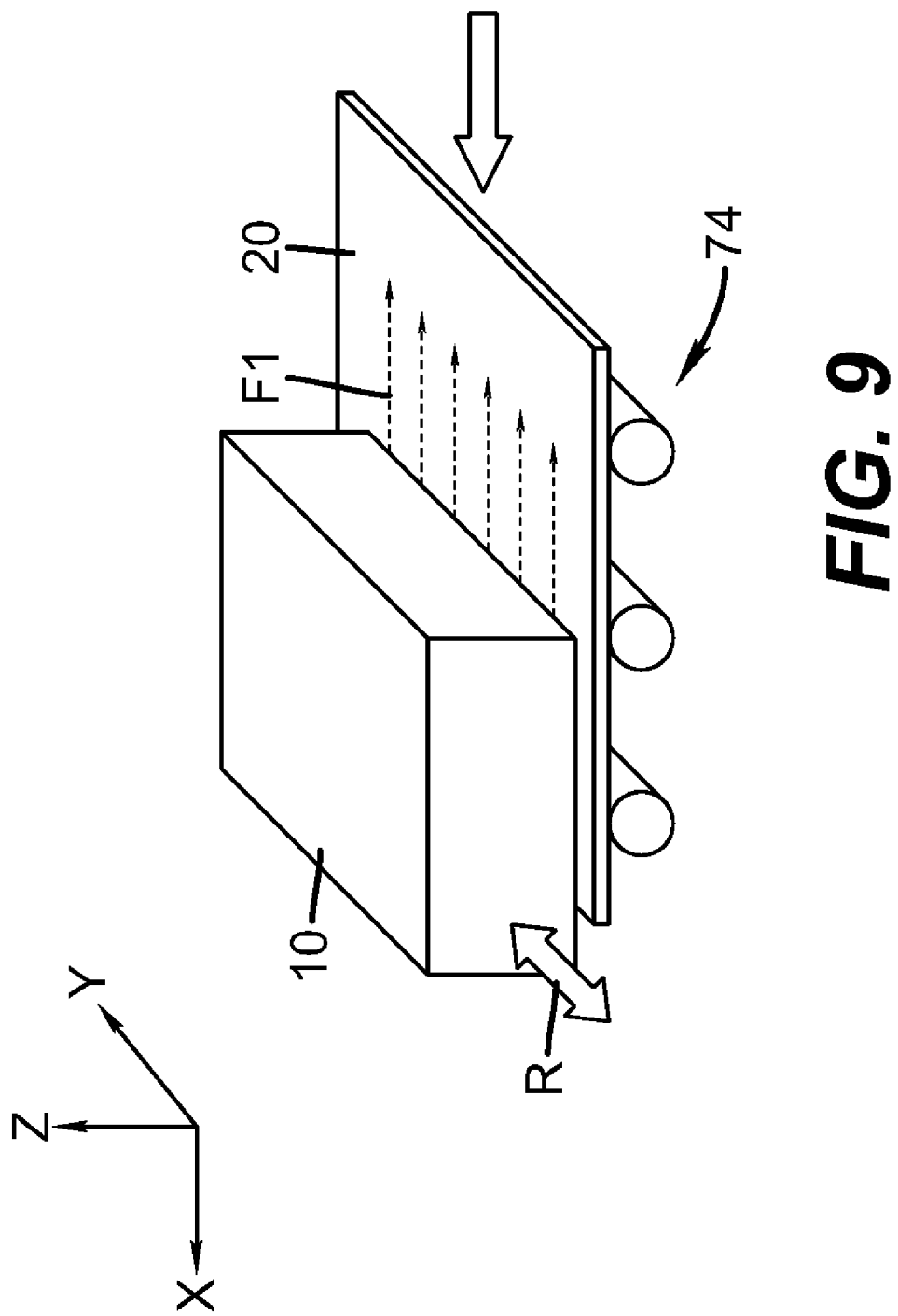
FIG. 9 is a schematic diagram showing an alternative motion pattern for reciprocating and orthogonal movement.

An advantage of the reciprocating motion used for a delivery head 10 used in one embodiment of the present process is that it allows deposition onto a substrate 20 whose area exceeds the area of output face 36. FIG. 9 schematically shows how this broader area coverage can be affected using reciprocating motion along the y axis as shown by arrow R and also movement orthogonal or transverse to the reciprocating motion, relative to the x axis. Again, it must be emphasized that motion in either the x or y direction, as shown in FIG. 9, can be effected either by movement of delivery head 10, or by movement of substrate 20 provided with a substrate support 74 that provides movement, or by movement of both delivery head 10 and substrate 20.

In FIG. 9 the relative motion of the delivery head 10 and the substrate 20 are perpendicular to each other. It is also possible to have this relative motion in parallel. In this case, the relative motion needs to have a nonzero frequency component that represents the oscillation and a zero frequency component that represents the displacement of the substrate 20. This combination can be achieved by: an oscillation combined with displacement of the delivery head 10 over a fixed substrate; an oscillation combined with displacement of the substrate 20 relative to a fixed substrate delivery head 10; or any combinations wherein the oscillation and fixed motion are provided by movements of both the substrate 20 and the delivery head 10.

In one embodiment, ALD can be performed at or near atmospheric pressure and over a broad range of ambient and substrate temperatures, for example at a temperature of under 300° C. Generally, a relatively clean environment is needed to minimize the likelihood of contamination. However, full "clean room" conditions or an inert gas-filled enclosure would not be required for obtaining good performance when using some embodiments of the method of the present invention.

Figure 10:
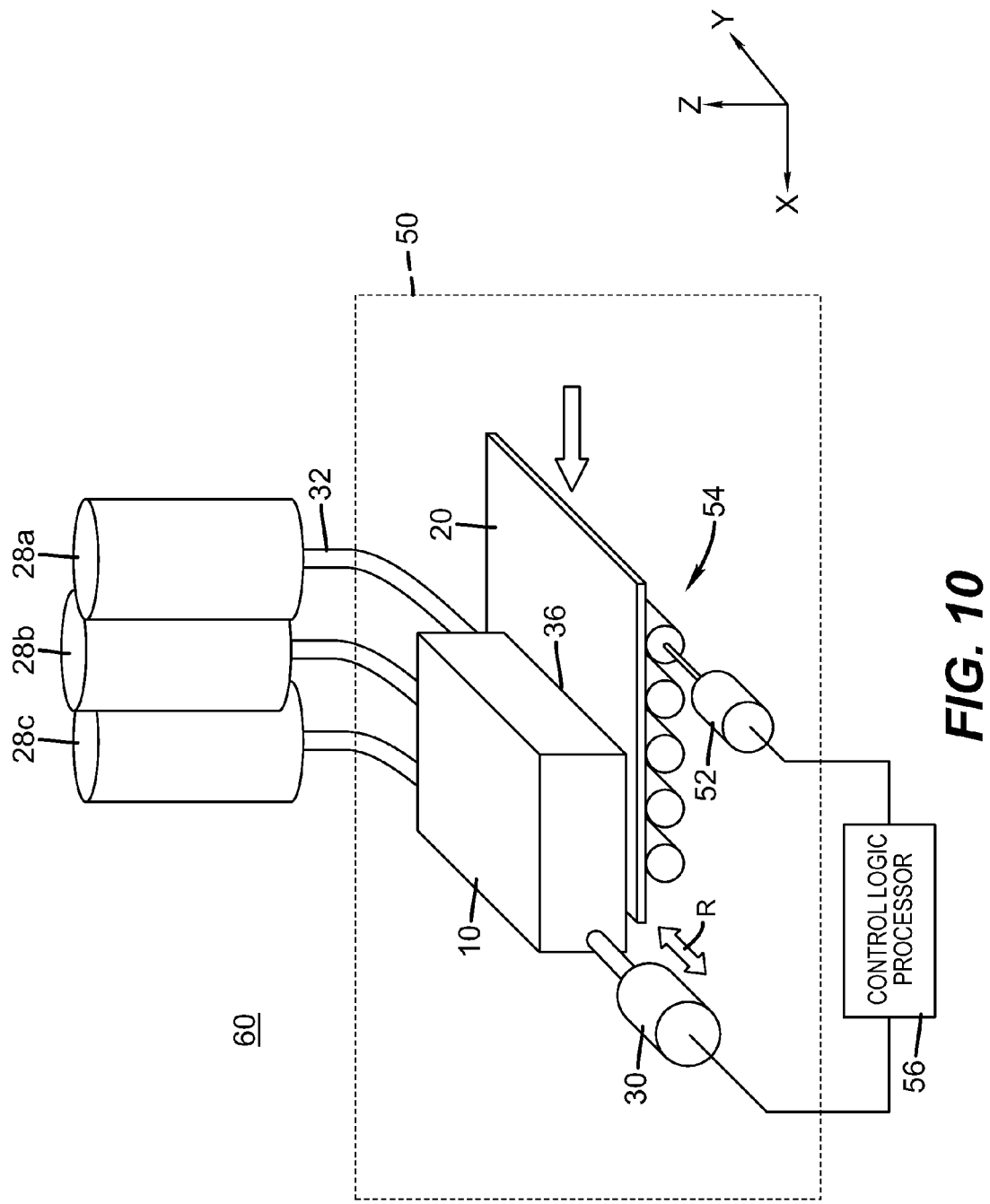
FIG. 10 is a block diagram for one embodiment of a deposition system that uses the method according to the present invention.

FIG. 10 shows an Atomic Layer Deposition (ALD) 60 process, for making a thin film, having a chamber 50 for providing a relatively well-controlled and contaminant-free environment. Gas supplies 28a, 28b, and 28c provide the first, second, and third gaseous materials to delivery head 10 through supply lines 32. The optional use of flexible supply lines 32 facilitates ease of movement of delivery head 10. For simplicity, an optional vacuum vapor recovery process and other support components are not shown in FIG. 10 but could also be used. A transport subsystem 54 provides a substrate support that conveys substrate 20 along output face 36 of delivery head 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 10, control logic processor 56 controls an actuator 30 for providing reciprocating motion to delivery head 10 and also controls a transport motor 52 of transport subsystem 54.

Figure 11:
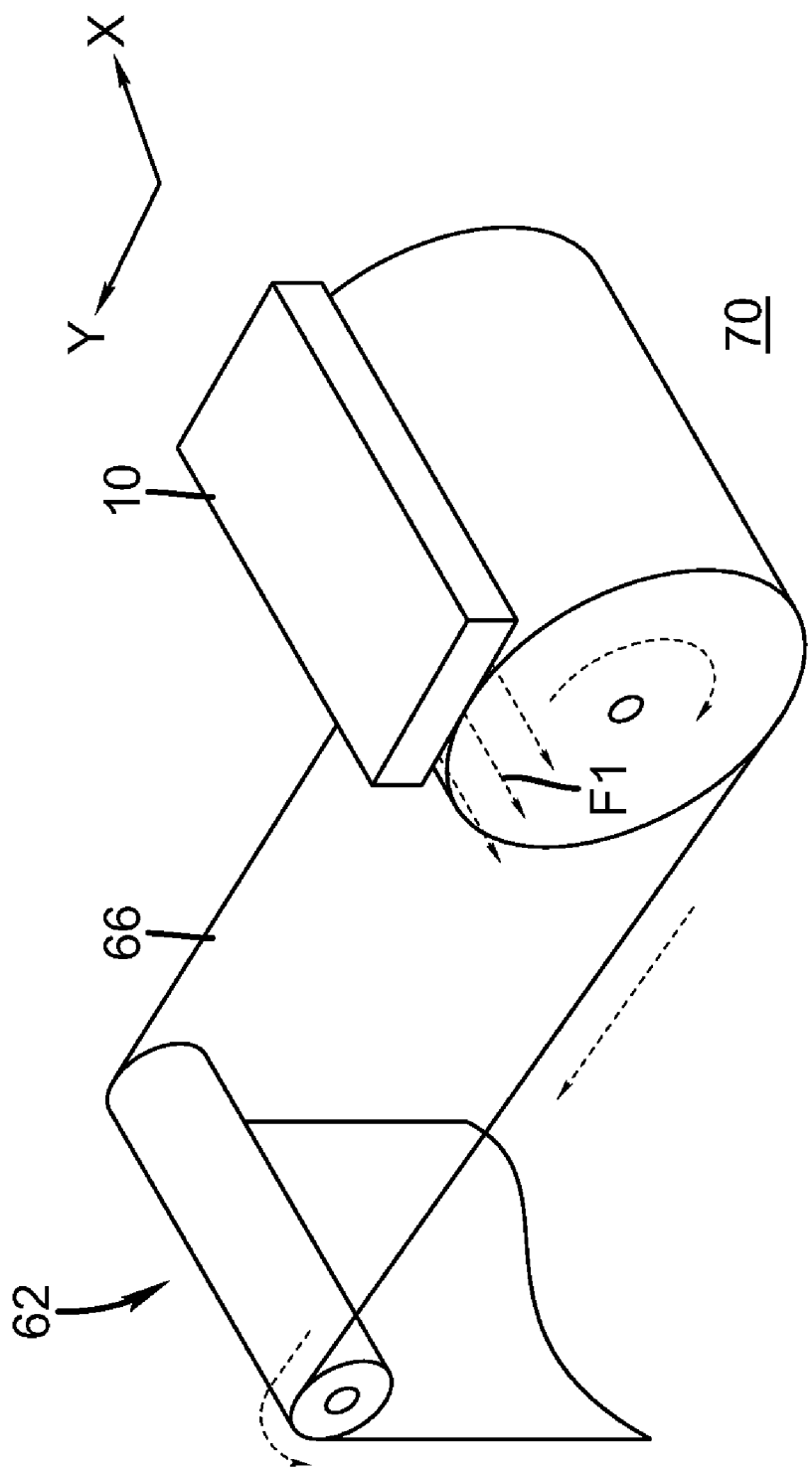
FIG. 11 is a block diagram showing another embodiment of deposition system applied to a moving web in accordance with the present invention, with the deposition device being kept stationary.

FIG. 11 shows an Atomic Layer Deposition (ALD) system 70 for depositing a thin film in a web arrangement, using a stationary delivery head 10 in which the flow patterns are oriented orthogonally to the configuration of FIG. 10. In this arrangement, motion of web conveyor 62 provides the movement needed for ALD deposition. Reciprocating motion could also be used in this environment, such as by repeatedly reversing the direction of rotation of a web roller to move web substrate 66 forward and backwards relative to delivery head 10. Reciprocation motion can also be obtained by allowing a reciprocating motion of the delivery head 10 across an arc whose axis coincides with the roller axis, while the web substrate 66 is moved in a constant motion. In another embodiment at least a portion of delivery head 10 has an output face 36 having an amount of curvature (not shown), which might be advantageous for some web coating applications. Convex or concave curvature could be provided.

Optionally, the present method can be accomplished with other apparatus or systems described in more detail in U.S. Pat. Nos. 7,413,982 and 7,456,429 and U.S. Patent Application Publications 2008/0166884 and 2009/0130858 (all noted above and incorporated by reference in their entirety).

In the embodiments in the latter three publications, a delivery device having an output face for providing gaseous materials for thin-film material deposition onto a substrate comprises elongated emissive channels in at least one group of elongated emissive channels, of the three groups of elongated emissive channels (namely, at least one group of: (i) one or more first elongated emissive channels, (ii) one or more second elongated channels, and (iii) a plurality of third elongated channels) that is capable of directing a flow, respectively, of at least one of the first gaseous material, second gaseous material, and the third gaseous material substantially orthogonally with respect to the output face of the delivery device, which flow of gaseous material is capable of being provided, either directly or indirectly from each of the elongated emissive channels in the at least one group, substantially orthogonally to the surface of the substrate.

In one embodiment, apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one such embodiment, the deposition device comprises exhaust channels, for example, a delivery device for thin-film material deposition onto a substrate comprising: (a) a plurality of inlet ports comprising at least a first inlet port, a second inlet port, and a third inlet port capable of receiving a common supply for a first reactive gaseous material, a second reactive gaseous material, and a third (inert purge) gaseous material, respectively, (b) at least one exhaust port capable of receiving exhaust gas from thin-film material deposition and at least two elongated exhaust channels, each of the elongated exhaust channels capable of gaseous fluid communication with the at least one exhaust port, and (c) at least three pluralities of elongated output channels, (i) a first plurality of first elongated output channels, (ii) a second plurality of second elongated output channels, and (iii) a third plurality of third elongated output channels, each of the first, second, and third elongated output channels capable of gaseous fluid communication, respectively, with one of the corresponding first inlet port, second inlet port, and third inlet port; wherein each of the first, second, and third elongated output channels and each of the elongated exhaust channels extend in a length direction substantially in parallel; wherein each first elongated output channel is separated on at least one elongated side thereof from a nearest second elongated output channel by a relatively nearer elongated exhaust channel and a relatively less near third elongated output channel; and wherein each first elongated emissive channel and each second elongated emissive channel is situated between relatively nearer elongated exhaust channels and between relatively less nearer elongated emissive channels.

Further embodiments can comprise a gas diffuser associated with at least one group of the three groups of elongated emissive channels such that at least one of the first, second, and third gaseous material, respectively, is capable of passing through the gas diffuser prior to delivery from the delivery device to the substrate, during thin-film material deposition onto the substrate, and wherein the gas diffuser maintains flow isolation of the at least one of first, second, and third gaseous material downstream from each of the elongated emissive channels in the at least one group of elongated emissive channels.

In one embodiment, such a gas diffuser is capable of providing a friction factor for gaseous material passing there through that is greater than $1 \times 10^2$, thereby providing back pressure and promoting equalization of pressure where the flow of the at least one first, second and third gaseous material exits the delivery device. In one embodiment of the invention, the gas diffuser comprises a porous material through which the at least one of the first, second, and third gaseous material passes. In a second embodiment of the invention, the gas diffuser comprises a mechanically formed assembly comprising at least two elements comprising interconnected passages, for example, in which nozzles are connected to a flow path provided by a thin space between parallel surface areas in the two elements.

In one embodiment, the one or more of the gas flows from the deposition devices provides a pressure that at least contributes to the separation of the surface of the substrate from the face of the delivery head, thereby providing a "floating head" or "air bearing" type deposition head, which can help to stabilize the gas flows and limit intermixing of the gas flows.

The method of the present invention is advantaged in its capability to perform deposition onto a substrate over a broad range of temperatures, including room or near-room temperature in some embodiments. The method can operate in a vacuum environment, but is particularly well suited for operation at or near atmospheric pressure.

It should be recognized that any ALD equipment may be used with deposition inhibitor materials. Other spatial ALD processes, such as those as described by previously referenced publications by Yudovsky and Dickey et al. and by U.S. Pat. No. 4,413,022 (Suntola et al.) are also useful with the present invention, and as such represent alternate embodiments herein. Traditional chamber based or temporal ALD processes may also be employed with the hydrophilic polymer deposition inhibitor materials of the present invention.

Figure 12A:
FIGS. 12A through 12E show the layers on the substrate at different points in the process in one embodiment of the present invention.
Figure 12B:
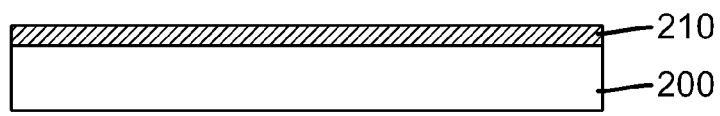
Figure 12C:
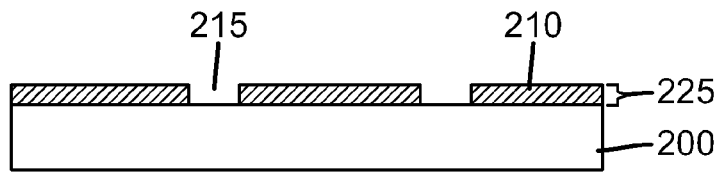
Figure 12D:
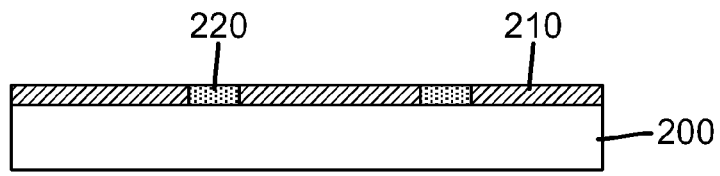
Figure 12E:
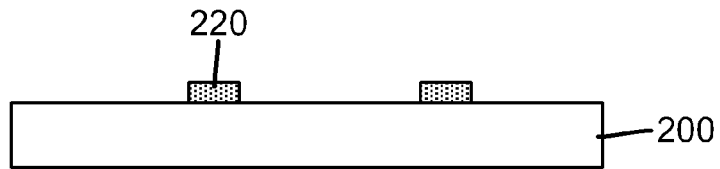

It is the goal of the present invention to provide a patterned thin film that is not only deposited via an ALD or CVD process, but simultaneously patterned using selective area deposition (SAD) materials and processes. As described above, SAD processes use a deposition inhibitor compound in order to inhibit the ALD growth of the thin film in the non-selected areas. This process can be better understood with reference to FIGS. 12A through 12E. FIG. 12A shows substrate 200 prior to the application of the deposition inhibitor material 210. Although the substrate 200 is illustrated as a bare substrate, one skilled in the art should recognize that substrate 200 might contain layers of materials, either patterned or unpatterned, to serve any purpose electrical, optical, or mechanical, as desired. FIG. 12B shows substrate 200 after a uniform deposition of deposition inhibitor material 210. FIG. 12C illustrates substrate 200 after the step of patterning the deposition inhibitor material 210 into deposition mask 225. The patterning can be done by any method known in the art, including photolithography using either positive or negative acting photoresists, laser ablation, or other subtractive processes. As shown, deposition mask 225 contains areas of deposition inhibitor material 210 and areas of substrate for deposition 215. FIG. 12D illustrates substrate 200 after the step of atomic layer deposition of the desired thin film material. As shown, thin film material 220 is only deposited on the substrate 200 where there was no deposition inhibitor material 210. The thin film material 220 does not form any appreciable thin film over deposition inhibitor material 210. FIG. 12E illustrates a patterned thin film material 220 after removing the deposition inhibitor material 210. It should be understood by one skilled in the art, that in some instances it would not be necessary to remove the deposition inhibitor material 210.

Figure 13A:
FIGS. 13A through 13D show the layers on the substrate at different points in another embodiment of the present invention.
Figure 13B:
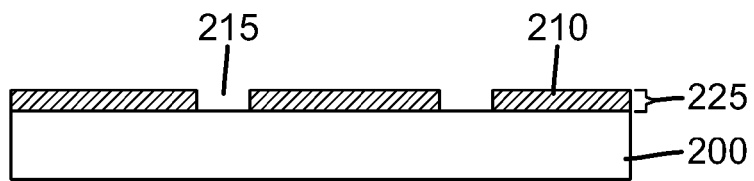
Figure 13C:
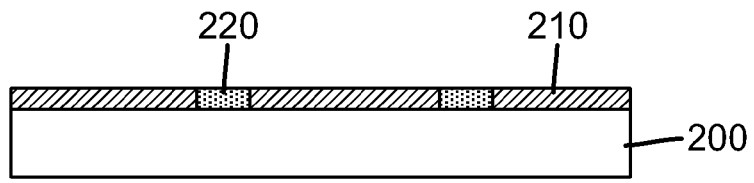
Figure 13D:
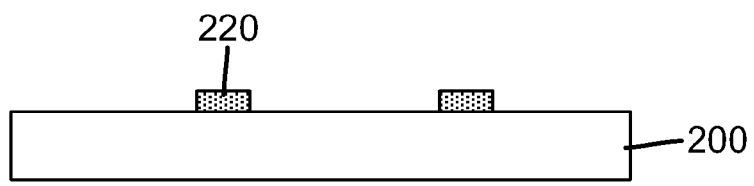

FIGS. 13A, 13C, and 13D should be understood with respect to the descriptions of FIGS. 12A, 12D, and 12E respectively. FIG. 13B illustrates a deposition mask 225 formed by patterned deposition of the deposition inhibitor material 210. Patterned deposition may be done using any additive printing method including, but not limited to inkjet, gravure, flexography, patch coating, screen printing, donor transfer, microcontact printing, or offset lithography.

The following Example is provided to illustrate the practice of this invention but it is not meant to be limiting in any manner.

The following procedure was used in the evaluation of the samples:

Measurement of Inhibition Power:

When a substrate surface containing no deposition inhibitor is subjected to ALD deposition, film growth occurs immediately upon commencement of the ALD exposure cycles. Alternatively, when a deposition inhibitor is present on a surface, initial application of ALD exposure cycles leads to no film growth. However, most deposition inhibitors do not inhibit perfectly. Thus, after continued application of ALD exposure cycles, there will be an onset of film growth on surfaces containing a deposition inhibitor. As defined above, the inhibition power of a selective area inhibitor is defined as the amount of film growth that would have occurred in the absence of deposition inhibitor prior to the onset of growth on a substrate that is coated with a deposition inhibitor. A higher inhibition power indicates a more effective deposition inhibitor.

In a typical process step employing a patterned selective area inhibitor, it is desired to grow a certain film thickness in the areas not containing deposition inhibitor. At the same time, it is desired that little or no deposition occur in regions containing the deposition inhibitor. Thus, the inhibition power can then be thought of as the maximum amount of film growth allowable when using a particular deposition inhibitor to pattern deposition.

To measure the inhibition, a glass substrate was spin coated with a deposition inhibitor solution and then baked in air to ensure complete removal of solvent. The same solution can be coated and baked on a bare silicon wafer in order to test that sample for film thickness using ellipsometry. The glass substrate for the inhibition test was then subjected to ALD growth using a gas bearing ALD coating head as described in U.S. Patent Application Publication 2009/0130858 (Levy). The coating head contained regions for a metal precursor, and oxygen precursor, and inert purge or separator gases.

To test deposition inhibitors, zinc oxide film growth at 200° C. was used. This deposition employed diethyl zinc (DEZ) as the zinc precursor and water as the oxygen precursor. During this deposition, the partial pressure of DEZ in the metal channels was 100 mtorr, while the partial pressure of water in the oxygen source channels was 50 mtorr. The inert gas and the carrier gases were nitrogen. The substrate speed yielded a channel residence time (thus ALD exposure time) of 63 msec (the same for all precursor and inert streams). At these conditions, an uninhibited substrate will experience a film growth of about 1.63 Å/cycle.

Film thickness of the resulting ZnO layers on top of the deposition inhibitor was determined by light absorption at 355 nm. The absorption was then be converted to thickness by a calibration. Samples containing a deposition inhibitor were subjected to ALD deposition for 50 cycles at a time and then characterized for thickness on the inhibitor. Once the onset of growth occurred, the number of cycles required to produce a film thickness of 100 Å on the deposition inhibitor surface was interpolated from the data. The thickness of a control containing no deposition inhibitor was then calculated for the same number of cycles using the above growth per cycle. The inhibition power of the deposition inhibitor was therefore the calculated growth that would have occurred on an uninhibited substrate minus the 100 Å allowance for film that had already grown on the deposition inhibitor.

In any test, the maximum number of ALD cycles tested was 1200, yielding a ZnO film on an uninhibited surface of approximately 2000 Å. Thus, samples that showed no growth at this time have a minimum inhibition power of 2000 Å.

Use of Hydrophilic Polymers Having Amide Groups

Polymers containing secondary or tertiary amide groups were tested for selective area inhibition as shown below in TABLE I. Polymer samples were spin coated at 3000 rpm on borosilicate glass, followed by baking at 180° C. to remove water that was the coating solvent. TABLE I also shows the coating solution concentration and resulting film thickness (certain thicknesses were estimated based upon previous measurements). Samples C-1 and C-2 were outside of the present invention while Samples I-1 through 1-3 were carried out according to this invention.

TABLE I

| Sample | Deposition Inhibitor Polymer | Molecular Weight | Solution Conc. (%) | Film Thickness (Å) |
|---|---|---|---|---|
| C-1 | Poly(acrylamide) | 5-6,000,000 | 0.5 | 70 |
| C-2 | Poly(acrylamide) | 10,000 | 0.5 | Est. 70 |
| I-1 | Poly(vinyl pyrrolidone) | 30,000 | 0.5 | 84 |
| I-2 | Poly(2-ethyl-2-oxazoline) | 200,000 | 0.5 | 91 |
| I-3 | Poly(N-vinyl acetamide) | 4-6,000,000 | 0.5 | Est. 80 |

TABLE II below shows the inhibition results of the polymer samples of TABLE I, as well as the number of ALD cycles required to achieve 100 Å of deposition on top of the deposition inhibitor and the corresponding inhibition power.

TABLE II

| Sample | Deposition Inhibitor Polymer | Cycles to 100 Å | Inhibition Power (Å) |
|---|---|---|---|
| C-1 | Poly(acrylamide) | 72 | 17 |
| C-2 | Poly(acrylamide) | 73 | 20 |
| I-1 | Poly(vinyl pyrrolidone) | >1200 | >2000 |
| I-2 | Poly(2-ethyl-2-oxazoline) | >1200 | >2000 |
| I-3 | Poly(N-vinyl acetamide) | 1027 | 1578 |

From TABLE II, it can be seen that poly(acrylamide), which exhibits primary substitution at the nitrogen of the amide groups, exhibited very poor inhibition. Two different samples of poly(acrylamide) with a very wide variation in molecular weight behaved similarly.

In contrast, poly(N-vinyl acetamide), which has secondary substitution at the nitrogen of the amide groups, showed a reasonably good inhibition power. Poly(vinyl pyrrolidone) and poly(2-ethyl-2-oxazoline), both of which have tertiary substitution at the amide nitrogen, showed excellent inhibition. Since poly(vinyl pyrrolidone) has an amide nitrogen in a pendant group and poly(2-ethyl-2-oxazoline) has an amide nitrogen in a polymer backbone location, it is clear that both configurations are effective demonstrations of these embodiments of this invention.

The invention has been described in detail with particular reference to certain preferred embodiments thereof, but it will be understood that variations and modifications can be effected within the spirit and scope of the invention.

The invention claimed is:

1. A deposition method for forming a patterned thin film comprising:
   A) applying a composition comprising a deposition inhibitor material to a substrate,
   B) simultaneously or subsequently to step A), patterning the deposition inhibitor material to provide selected areas on the substrate where the deposition inhibitor material is absent, and
   C) depositing an inorganic thin film on the substrate by chemical vapor deposition only in those areas where the deposition inhibitor material is absent,
   wherein the deposition inhibitor material is a hydrophilic polymer that has in its backbone, side chains, or both backbone and side chains, multiple secondary or tertiary amide groups that are represented by the following acetamide structure:
   >N—C(=O)—, and wherein the hydrophilic polymer satisfies both of the following tests:
   a) it is soluble to at least 1% by weight in a solution containing at least 50 weight % water as measured at 40° C., and
   b) it provides an inhibition power of at least 200 Å to deposition of zinc oxide by an ALD process.

2. The method of claim 1 wherein the inorganic thin film is deposited on the substrate by atomic layer deposition.

3. The method of claim 2 wherein the inorganic thin film is deposited using spatially dependant ALD that comprises:
   providing a series of gas channels, each in contact with a discrete separate region of a substrate, and each gas channel having a gas composition, the gas composition comprising, in order, at least a first reactive gaseous material, an inert purge gas, and a second reactive gaseous material, and optionally repeating this sequence a plurality of times,
   moving the substrate relative to the gas channels so that a portion of the substrate comes into contact sequentially with at least two gas zones,
   wherein the first reactive gaseous material is capable of reacting with a substrate surface that has been treated with the second reactive gaseous material to form the inorganic thin film.

4. The method of claim 3 wherein the second reactive gaseous material is a non-metallic compound.

5. The method of claim 1 wherein at least some of the acetamide groups are recurring and form at least part of the hydrophilic polymer backbone through the nitrogen atom.

6. The method of claim 1 wherein the hydrophilic polymer is poly(vinyl pyrrolidone), poly(N-vinyl acetamide), or poly(2-ethyl-2-oxazoline), or a mixture of two or more of these polymers.

7. The method of claim 1 wherein the inorganic thin film is either a metal or a metal containing compound.

8. The method of claim 7 wherein the metal-containing compound contains a group V or group VI anion, or it is an oxide, nitride, sulfide, or phosphide, or a combination thereof.

9. The method of claim 7 wherein inorganic thin film contains zinc, aluminum, hafnium, zirconium, or indium, or any combination of these metals.

10. The method of claim 7 wherein the inorganic thin film contains copper, tungsten, aluminum, nickel, ruthenium, or rhodium.

11. The method of claim 1 wherein the inorganic thin film contains zinc oxide.

12. The method of claim 1 wherein step A is depositing a uniform layer of the composition comprising the deposition inhibitor material.

13. The method of claim 1 wherein step A is depositing a pattern of the composition comprising the deposition inhibitor material.

14. The method of claim 13 wherein the composition comprising the deposition inhibitor material is deposited by inkjet printing, gravure, flexography, donor transfer, micro-contact printing, or offset lithography.

15. The method of claim 1 wherein a given area of the substrate is exposed to a gas composition in an elongated opening for less than 100 milliseconds.

16. The method of claim 1 wherein the substrate or a support for the substrate comprises a moving web.

* * * * *